US011417655B2

(12) United States Patent
Dewey et al.

(10) Patent No.: US 11,417,655 B2
(45) Date of Patent: Aug. 16, 2022

(54) HIGH-MOBILITY SEMICONDUCTOR SOURCE/DRAIN SPACER

(71) Applicant: Intel Corporation, Santa Clara, CA (US)

(72) Inventors: Gilbert Dewey, Hillsboro, OR (US); Matthew V. Metz, Portland, OR (US); Anand S. Murthy, Portland, OR (US); Tahir Ghani, Portland, OR (US); Willy Rachmady, Beaverton, OR (US); Chandra S. Mohapatra, Beaverton, OR (US); Jack T. Kavalieros, Portland, OR (US); Glenn A. Glass, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/242,946

(22) Filed: Jan. 8, 2019

(65) Prior Publication Data
US 2019/0148378 A1   May 16, 2019

Related U.S. Application Data

(63) Continuation of application No. 15/574,820, filed as application No. PCT/US2015/038099 on Jun. 26, 2015, now Pat. No. 10,211,208.

(51) Int. Cl.
*H01L 27/092* (2006.01)
*H01L 29/66* (2006.01)
(Continued)

(52) U.S. Cl.
CPC ...... *H01L 27/0924* (2013.01); *H01L 21/8258* (2013.01); *H01L 21/82385* (2013.01);
(Continued)

(58) Field of Classification Search
CPC .............. H01L 29/1037; H01L 29/205; H01L 29/66522; H01L 29/66636;
(Continued)

(56) References Cited

U.S. PATENT DOCUMENTS

| 4,566,025 A | 1/1986 | Jastrzebski et al. |
| 5,296,401 A * | 3/1994 | Mitsui ............ H01L 21/823864 257/E21.64 |

(Continued)

FOREIGN PATENT DOCUMENTS

| CN | 101908543 | 12/2010 |
| KR | 20040077289 | 9/2004 |

(Continued)

OTHER PUBLICATIONS

Extended European Search Report dated Jan. 16, 2019 for EP Patent Application No. 15896570.7.
(Continued)

*Primary Examiner* — Jesse Y Miyoshi
(74) *Attorney, Agent, or Firm* — Essential Patents Group, LLP

(57) ABSTRACT

Monolithic FETs including a majority carrier channel in a first high carrier mobility semiconductor material disposed over a substrate. While a mask, such as a gate stack or sacrificial gate stack, is covering a lateral channel region, a spacer of a high carrier mobility semiconductor material is overgrown, for example wrapping around a dielectric lateral spacer, to increase effective spacing between the transistor source and drain without a concomitant increase in transistor footprint. Source/drain regions couple electrically to the lateral channel region through the high-mobility semiconductor spacer, which may be substantially undoped (i.e. intrinsic). With effective channel length for a given lateral gate dimension increased, the transistor footprint for a given
(Continued)

off-state leakage may be reduced or off-state source/drain leakage for a given transistor footprint may be reduced, for example.

6 Claims, 10 Drawing Sheets

(51) Int. Cl.
H01L 29/78 (2006.01)
H01L 29/423 (2006.01)
H01L 29/786 (2006.01)
H01L 29/10 (2006.01)
H01L 29/08 (2006.01)
H01L 29/205 (2006.01)
H01L 21/8258 (2006.01)
H01L 21/8238 (2006.01)

(52) U.S. Cl.
CPC ........ H01L 21/823807 (2013.01); H01L 21/823814 (2013.01); H01L 21/823821 (2013.01); H01L 29/0847 (2013.01); H01L 29/1037 (2013.01); H01L 29/1054 (2013.01); H01L 29/205 (2013.01); H01L 29/42376 (2013.01); H01L 29/42392 (2013.01); H01L 29/66522 (2013.01); H01L 29/66545 (2013.01); H01L 29/66795 (2013.01); H01L 29/785 (2013.01); H01L 29/7851 (2013.01); H01L 29/78696 (2013.01)

(58) Field of Classification Search
CPC ......... H01L 29/66795; H01L 29/66818; H01L 27/0922; H01L 27/0924; H01L 27/0688; H01L 21/823814; H01L 21/823821
See application file for complete search history.

(56) References Cited

U.S. PATENT DOCUMENTS

| | | | |
|---|---|---|---|
| 6,121,100 A | 9/2000 | Andideh et al. | |
| 7,227,224 B2 | 6/2007 | Ko et al. | |
| 8,264,032 B2 | 9/2012 | Yeh | |
| 8,674,341 B2 | 3/2014 | Ko | |
| 9,153,583 B2 | 10/2015 | Glass et al. | |
| 9,257,348 B2 | 2/2016 | Xie et al. | |
| 9,356,046 B2 | 5/2016 | Cheng et al. | |
| 9,653,580 B2 | 5/2017 | Balakrishnan | |
| 2002/0185679 A1 | 12/2002 | Baliga | |
| 2004/0211955 A1 | 10/2004 | Hsu et al. | |
| 2005/0093033 A1 | 5/2005 | Kinoshita et al. | |
| 2007/0090416 A1 | 4/2007 | Doyle et al. | |
| 2009/0108350 A1 | 4/2009 | Cai et al. | |
| 2010/0025771 A1 | 2/2010 | Hoentschel et al. | |
| 2010/0148153 A1 | 6/2010 | Hudait et al. | |
| 2010/0163847 A1 | 7/2010 | Majhi | |
| 2010/0193840 A1 | 8/2010 | Doyle et al. | |
| 2010/0252862 A1 | 10/2010 | Ko | |
| 2011/0133292 A1 | 6/2011 | Lee | |
| 2012/0007183 A1 | 1/2012 | Chang et al. | |
| 2012/0139047 A1 | 6/2012 | Luo et al. | |
| 2012/0248502 A1 | 10/2012 | Cheng et al. | |
| 2013/0056795 A1 | 3/2013 | Wu et al. | |
| 2013/0113051 A1 | 5/2013 | Cai et al. | |
| 2013/0134488 A1 | 5/2013 | Fumitake | |
| 2013/0154016 A1* | 6/2013 | Glass | H01L 29/267 257/368 |
| 2013/0228875 A1 | 9/2013 | Lee et al. | |
| 2014/0070276 A1* | 3/2014 | Ko | H01L 21/28264 257/192 |
| 2014/0084239 A1 | 3/2014 | Radosavljevic et al. | |
| 2014/0175515 A1 | 6/2014 | Then et al. | |
| 2014/0252478 A1 | 9/2014 | Doornbos et al. | |
| 2014/0374841 A1 | 12/2014 | Wang et al. | |
| 2015/0021662 A1 | 1/2015 | Basu et al. | |
| 2015/0025546 A1 | 1/2015 | Taylor et al. | |
| 2015/0076620 A1* | 3/2015 | Waldron | H01L 29/20 257/401 |
| 2015/0093868 A1 | 4/2015 | Obradovic et al. | |
| 2015/0228795 A1 | 8/2015 | Yang et al. | |
| 2015/0236114 A1 | 8/2015 | Ching et al. | |
| 2015/0243756 A1 | 8/2015 | Obradovic et al. | |
| 2015/0255456 A1 | 9/2015 | Jacob et al. | |
| 2015/0255460 A1 | 9/2015 | Cheng et al. | |
| 2015/0255545 A1 | 9/2015 | Holland et al. | |
| 2015/0255548 A1 | 9/2015 | Holland | |
| 2015/0263138 A1 | 9/2015 | Kim | |
| 2015/0263159 A1 | 9/2015 | Ching et al. | |
| 2016/0005834 A1 | 1/2016 | Pawlak et al. | |
| 2016/0043188 A1 | 2/2016 | Chu et al. | |
| 2016/0204263 A1 | 7/2016 | Mukherjee et al. | |
| 2017/0047404 A1 | 2/2017 | Bentley et al. | |
| 2018/0145077 A1 | 5/2018 | Dewey et al. | |
| 2018/0254332 A1 | 9/2018 | Mohapatra et al. | |

FOREIGN PATENT DOCUMENTS

| | | |
|---|---|---|
| KR | 20140097464 | 8/2014 |
| TW | 201513231 | 4/2015 |
| TW | 201521095 | 6/2015 |

OTHER PUBLICATIONS

Ayers, J.E., "Epitaxy", <http://engr.uconn.edu/~jayers/epitaxy.htm>, online Jun. 15, 2015, 16 pgs.
Huang, C-Y, "III-V Ultra-Thin-Body InGaAs/InAs MOSFETs for Low Standby Power Logic Applications", University of California Santa Barbara, Doctoral Thesis, Sep. 2015, pp. 1-167.
Nahory, R.E., "Band gap versus composition and demonstration of Vegard's law for In1-xGaxAsyP1-y lattice matched to LnP", App. Phys. Lett. 33(7), pp. 659-661, Oct. 1978.
Nahory, R.E., "Enegry-Gap Values for InxGA1-xAs at 300k", The Semiconductors-Information Web-Site, <hhttps://www.semiconductors.co.uk/eg(ingaas).html>, 4 pgs.
Porod, W., "Modification of the virtual-crystal approximation for ternary III-V compounds", Phys. Rev., B27, No. 4, pp. 2587-2589, Feb. 15, 1983.
Office Action from Taiwan Patent Application No. 105115539 notified Feb. 20, 2020, 34 pgs.
International Preliminary Report on Patentability for International Patent Application No. PCT/US15/38099, dated Jan. 4, 2018.
International Search Report and Written Opinion for International Patent Application No. PCT/US15/38099, dated Mar. 28, 2016.
Non-Final Office Action for U.S. Appl. No. 15/574,820, dated Jun. 15, 2018.
Notice of Allowance dated Oct. 10, 2018 for U.S. Appl. No. 15/574,820.
Notice of Allowance from Taiwan Patent Application No. 105115539 notified Oct. 19, 2020, 3 pgs.
Office Action from European Patent Application No. 15896570.7 notified Jun. 19, 2020, 4 pgs.
Office Action from Chinese Patent Application No. 201580080339.X notified Jun. 1, 2021, 15 pgs.
Office Action from Korean Patent Application No. 10-2018-7002086 notified Jun. 29, 2021, 17 pgs.
Office Action from Chinese Patent Application No. 20158008039.X notified Nov. 1, 2021, 9 pgs.
Office Action from Korean Patent Application No. 10-2018-7002086 notified Jan. 14, 2022, 5 pgs.
Office Action from Taiwanese Patent Application No. 110101983 notified Aug. 25, 2021, 25 pgs.
Notice of Allowance from Chinese Patent Application No. 201580080339.X dated Apr. 15, 2022, 4 pgs.
Notice of Allowance from Taiwanese Patent Application No. 110101983 dated Jan. 26, 2022, 3 pgs.

* cited by examiner

US 11,417,655 B2

HIGH-MOBILITY SEMICONDUCTOR SOURCE/DRAIN SPACER

CLAIM FOR PRIORITY

This application is a continuation of U.S. patent application Ser. No. 15/574,820, filed on 16 Nov. 2017, titled "HIGH-MOBILITY SEMICONDUCTOR SOURCE/DRAIN SPACER", which claims priority to PCT Patent Application Serial No. PCT/US2015/038099, filed on 26 Jun. 2015, titled "HIGH-MOBILITY SEMICONDUCTOR SOURCE/DRAIN SPACER", both of which are incorporated herein by reference in their entirety for all purposes.

BACKGROUND

Efforts to extend Moore's law for integrated circuitry (IC) have included development of transistors employing materials other than silicon, such as III-V compound semiconductor materials (e.g., InP, InGaAs, InAs). These non-silicon material systems typically display higher carrier mobility than silicon devices, and so their introduction has long been suggested as path toward faster transistors. However, along with higher carrier mobility, in a field effect transistor (FET) the off-state ($I_{off}$) leakage between source and drain can be significantly higher for III-V (and Ge) channeled device than for a silicon-based FET of equal effective (electrical) channel length. As off-state leakage is generally an exponential function of effective channel length, it may be unclear how transistor density, rather than transistor speed, might be improved through the use of high-mobility semiconductor materials.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
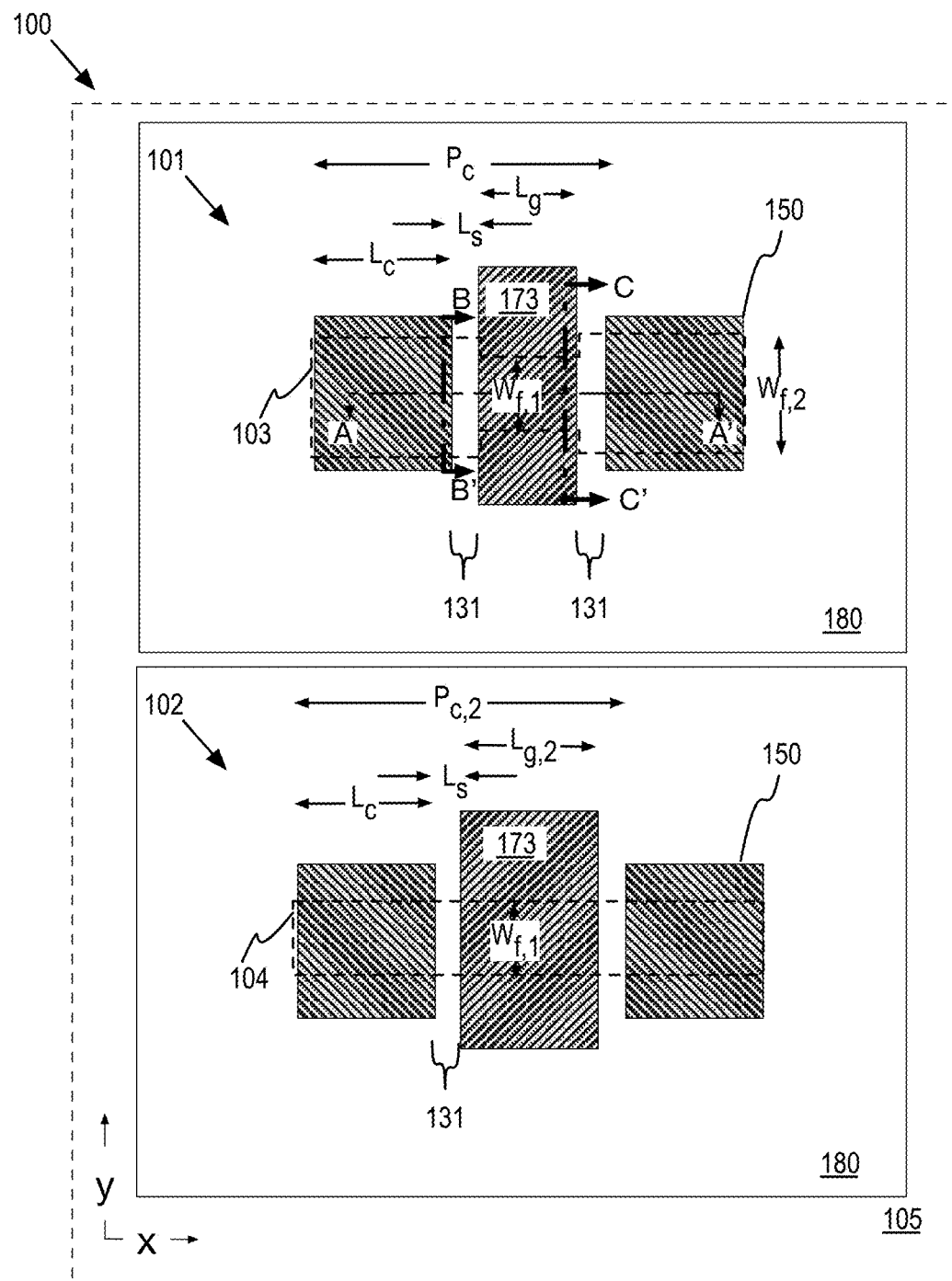
FIG. 1 is a plan view of complementary metal-oxide-semiconductor (CMOS) circuitry including a high-mobility finFET and a silicon-channeled finFET disposed over a substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In further reference to extending Moore's Law, one way to scale FET gate lengths and maintain good gate control of the channel is to do so without impacting source/drain distance, which depending on device architecture may entail moving a lightly doped (or undoped) source/drain tip region farther out from under the gate stack. One example is moving from an "overlapped gate" to an "underlapped gate," which generally increases the effective channel length $L_{eff}$ for a given gate length $L_g$. A disadvantage of a larger underlap in silicon-based transistors is a significantly increased transistor resistance degrading performance. Also, if the footprint or area of the transistor cell is reduced, for example by reducing the gate length while increasing underlap, source/drain area may also need to decrease, potentially exacerbating the increase in transistor resistance caused by the larger underlap.

In embodiments described further below, a high-mobility semiconductor material is employed for a majority carrier transistor channel. As used herein, a "high-mobility" material is a semiconductor material other than silicon that has a carrier mobility higher than the mobility of that carrier for a corresponding channel of silicon. Notably, where carrier mobility is higher, gate underlap of source/drain (tip) regions may be increased more significantly than for a reference silicon FET as the associated resistance penalty is less severe. This greater freedom to increase underlap may be leveraged to maintain an effective channel length sufficient to remain below a threshold transistor leakage level. In further embodiments, this greater freedom to increase underlap is leveraged without increasing an area of the transistor cell, or by reducing source/drain area, by extending the channel length in a direction non-parallel (e.g., orthogonal) to the lateral gate length. In some advantageous embodiments, this greater freedom to increase underlap is leveraged to reduce an area of the transistor cell without degrading transistor performance characteristics below that of a reference silicon-channeled device, enabling greater device density.

In some embodiments described further below, monolithic FETs include a majority carrier channel in a first high-mobility semiconductor material disposed over a substrate. A gate stack is disposed over a lateral channel region of the first semiconductor material. A pair of source/drain regions are at least vertically spaced apart from the lateral channel region by a thickness of high-mobility semiconductor material. In some embodiments, the same high-mobility semiconductor material employed in the lateral channel region provides the vertical spacing. The first high-mobility semiconductor material then has a substantially greater film thickness, as measured normal to an underlying interface and/or the substrate, than the lateral channel region. Carriers traversing a shortest $L_{eff}$ between the source and drain may therefore not only traverse laterally under the gate stack, but also traverse an additional distance through the semiconductor source/drain spacer. Because this additional distance can be substantially orthogonal to the lateral channel length associated with a patterned gate, device density may be improved.

In some embodiments described further below, while a mask, such as a gate stack or sacrificial gate stack, is covering a lateral channel region, semiconductor material having a high carrier mobility and advantageously low impurity doping is overgrown, for example wrapping around a dielectric spacer and increasing $L_{eff}$ between the transistor source and drain without a concomitant increase in transistor footprint. Instead of transistor cell area increasing, a thickness of the doped source/drain film and/or source/drain contact metallization is instead correspondingly reduced. Defining a transistor channel region as that which separates a heavily doped source semiconductor from a heavily doped drain semiconductor, the high-mobility semiconductor spacer may also be described as an orthogonal channel region extending beyond the gate stack. Advantages of overgrowing the semiconductor spacer to form the orthogonal channel region relative to recessing the lateral channel region are also described further below in the context of one or more non-planar (fin)FET transistor architectures.

FIG. 1 is a plan view of complementary metal-oxide-semiconductor (CMOS) circuitry 100 including a high-mobility finFET 101 and a silicon-channeled finFET 102 disposed over a substrate 105 and surrounded by an isolation material 180, in accordance with some embodiments. In the exemplary embodiment, finFET 101 is an NMOS device while finFET 102 is a PMOS device. For such embodiments, finFET 102 may have any architecture while finFET 101 has one or more of the features described further below. In alternate embodiments, a high-mobility NMOS finFET 101 is coupled with a high-mobility PMOS finFET 102. For such alternate embodiments, both finFET 101 and finFET 102 may have one or more of the features described further below.

In some embodiments, substrate 105 is silicon (Si), which is advantageous for monolithic integration of finFETs 101 and 102. Crystallographic orientation of a substantially monocrystalline substrate 105 in exemplary embodiments is (100), (111), or (110). However, other crystallographic orientations are also possible. For example, the substrate working surface may be miscut, or offcut 2-10° toward 11101 to facilitate nucleation of crystalline heteroepitaxial material. Other substrate embodiments are also possible. For example, substrate 105 may be any of silicon-carbide (SiC), sapphire, III-V compound semiconductor (e.g., GaAs), silicon on insulator (SOI), germanium (Ge), or silicon-germanium (SiGe). Isolation material 180 may be any material suitable for providing electrical isolation between transistors. In some exemplary embodiments, isolation material 180 is silicon dioxide. Other materials known to be suitable for the purpose may also be utilized, including low-k materials (e.g., having a relative dielectric constant below 2.5).

In the illustrated embodiment, finFET 101 is associated with a transistor cell area smaller than the transistor cell area associated with finFET 102. Specifically, gate length $L_g$ associated with finFET 101 is less than a corresponding gate length $L_{g,2}$ associated with finFET 102. For clarity, source/drain contact length Le and lateral spacing $L_s$ between source/drain contact metallization 150 and an edge of gate electrode 173 are both equivalent for the two finFETs 101, 102. In this example therefore, the gate length shrink in finFET 101 is manifested as a reduction in source/drain contact metallization pitch $P_c$ of finFET 101 relative to finFET 102. A longest lateral length fin 103 may then be shorter than the corresponding length of fin 104. In other embodiments where access resistance for finFET 101 is relatively high, the gate length shrink in finFET 101 may be utilized for increased source/drain contact length $L_c$ without increasing contact metallization pitch $P_c$ of finFET 101 beyond that of finFET 102. As noted above, off-state leakage current for a high-mobility channel material is often considerably higher than for a silicon-channeled device of comparable effective channel length. Thus, in some embodiments, a difference between the effective channel length and the gate length $L_g$ of finFET 101 is greater than the corresponding difference between the effective channel length and the gate length $L_{g,2}$ of finFET 102. As further described below, a high-mobility semiconductor source/drain spacer disposed within lateral spacing 131 accounts for this larger difference.

Although specific dimensions vary with device technology generation, in one example where $L_{g,2}$ is approximately 10 nm, $L_g$ may be 2-5 nm smaller, providing up to a 50% lateral gate shrink. Within lateral spacing 131, which may be 3-5 nm for example, a high-mobility semiconductor source/drain spacer may stand-off a heavily doped source/drain region by an additional 1-5 nm. A total increase in effective channel length is then 2-10 nm. Therefore, even with a shorter gate length (i.e., $L_g < L_{g,2}$), finFET 101 may have a longer effective channel length than that of finFET 102. Depending on how off-state leakage varies as a function of effective channel length for the particular high-mobility channel material, finFET 102 may therefore display off-state leakage comparable to, or better than, that of finFET 102. Notably, absent the use of high-mobility material, the increase in resistance associated with the greater effective channel length would typically result in a net degradation in transistor performance. The lateral dimension shrink would therefore be less advantageous for a silicon-based device, in effect reducing $f_{max}$ to achieve a greater density of devices having a given $f_t$. However, a similar methodology may be applied to shrink the cell of PMOS finFET 102 without such a sacrifice if the channel is of a suitable high (hole) mobility material (e.g., Ge) that enables $f_{max}$ to remain on par with the slower silicon-channeled device.

In embodiments, a transverse width of a non-planar semiconductor body (i.e., fin) varies from a minimum within the gate length $L_g$ to a maximum within end portions of the body beyond edges of the gate stack. For example as illustrated in FIG. 1, finFET 101 has a minimum transverse fin width $W_{f,1}$ under gate metal 173 and denoted by dashed line. Fin width $W_{f,1}$ may vary with implementation, but in exemplary embodiments is less than 20 nm and advantageously less than 10 nm. The fin width at least within lateral spacing 131 is $W_{f,2}$, which is larger than $W_{f,1}$. The difference between $W_{f,1}$ and $W_{f,2}$ is indicative of the high-mobility semiconductor source/drain spacer. In some advantageous embodiments, the difference between $W_{f,1}$ and $W_{f,2}$ is approximately twice the thickness of the high-mobility semiconductor source/drain spacer (e.g., 2-10 nm). In further embodiments, the minimum fin width of finFET 101 is equal to the fin width of finFET 102 (i.e., also $W_{f,1}$). As further noted in FIG. 1, at least for an exemplary silicon channel embodiment finFET 102, transverse fin width within spacing 131 remains constant at $W_{f,1}$.

Figure 2A:
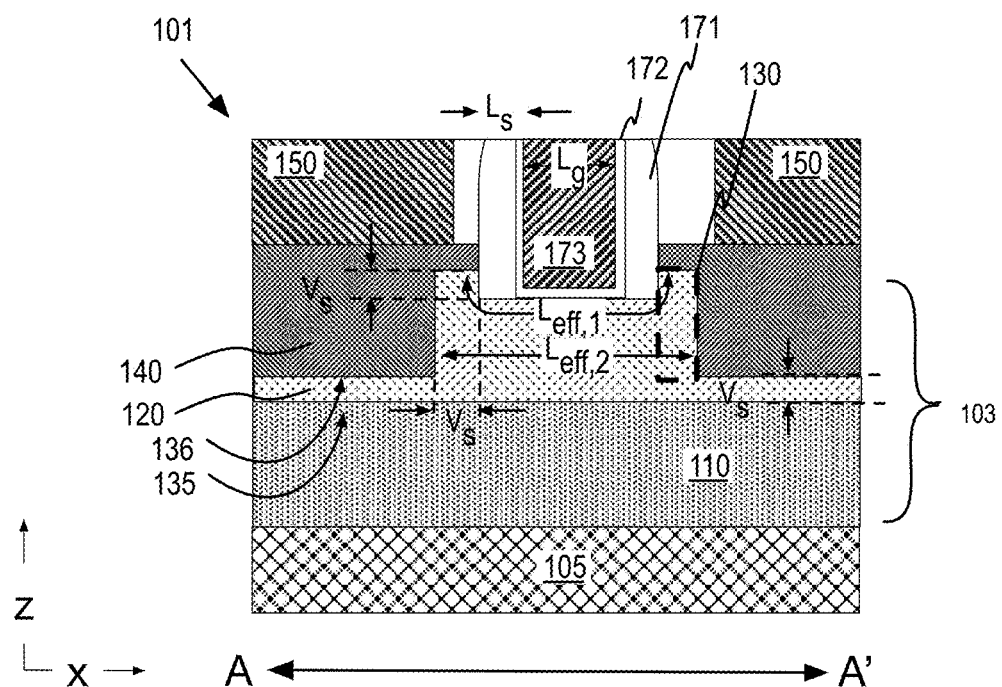
FIG. 2A illustrates a cross-sectional view through a length of channel region and source/drain of the high-mobility finFET depicted in FIG. 1, in accordance with some embodiments.

A fin of first high-mobility material may be disposed directly on a substrate or some intervening material. In some exemplary embodiments, transistor 101 incudes a semiconductor heterojunction fin ("hetero-fin") structure 103 that further includes a first high-mobility material disposed on a "sub-fin" of a second high-mobility material, as further described below. FIG. 2A illustrates a cross-sectional view through a length of channel region and source/drain of high-mobility finFET 101 along the A-A' plane denoted in FIG. 1, in accordance with some embodiments. Hetero-fin 103 includes a fin 120 of a high-mobility semiconductor material disposed on a sub-fin 110 of a second semiconductor material. The two materials of differing composition form a heterojunction 135. In the exemplary embodiments where sub-fin 110 is not to serve as part of the device channel, sub-fin 110 need not be of a material having high electron mobility. In some advantageous embodiments, sub-fin 110 is a second material of suitable composition so that heterojunction 135 is associated with a bandgap differential leading to at least a conduction band offset between the fin 120 and sub-fin 110 useful for reducing leakage current through sub-fin 110.

In some embodiments, sub-fin 110 and fin 120 are each monocrystalline with a first sub-lattice of at least one element from group III of the periodic table (e.g., Al, Ga, In, etc.), and a second sub-lattice of at least one element of group V of the periodic table (e.g., N, P, As, Sb, etc.). Sub-fin 110 and fin 120 may each be a binary, ternary, or quaternary III-V compound semiconductor including two, three, or even four elements from groups III and V of the periodic table, respectively.

Because fin 120 is a device layer of N-type transistor 101, it is advantageously a III-V material having a high electron mobility, such as, but not limited to InGaAs, InP, InSb, and InAs. For some exemplary InGaAs fin embodiments, the mole fraction of In is between 0.2 and 0.8. In some advantageous embodiments, a lateral channel region of fin 120 disposed immediately below the gate stack (including gate dielectric 172 and gate electrode 173) is intrinsic III-V material and not intentionally doped with any electrically active impurity for highest mobility. In alternate embodiments, a nominal background n-type dopant level may be present within the lateral channel region, for example to set a threshold voltage $V_t$.

Sub-fin 110 is advantageously a III-V material having a significant (e.g., conduction) band offset to the fin material, such as but not limited to GaAs, GaSb, GaAsSb, GaP, InAlAs, GaAsSb, AlAs, AlP, AlSb, and AlGaAs. In some embodiments, fin 120, and sub-fin 110 are of complementary impurity types. For example, where fin 120 is to provide an electron majority carrier channel, sub-fin 110 may be doped with p-type impurities (e.g., Mg, Be, etc.).

Fin 120 includes a lateral channel region disposed below (or covered by) gate electrode 173 and gate dielectric 172. Lateral channel region is further disposed below (or covered by) dielectric lateral spacers 171 adjacent to opposite edges of gate electrode 173. In some embodiments, a high-mobility semiconductor spacer comprises the same semiconductor material as the lateral channel region. For such embodiments, there may be no compositional interface between the lateral channel region and the semiconductor spacer. In alternative embodiments, the high-mobility semiconductor spacer comprises a different semiconductor material than the lateral channel region.

FIG. 2A illustrates an exemplary embodiment where the high-mobility semiconductor spacer comprises the same semiconductor material as the lateral channel region. A dashed line box therefore denotes the semiconductor spacer 130. For embodiments where the high-mobility semiconductor spacer comprises a different semiconductor material than the lateral channel region, the material composition within the dashed box would be different than below gate electrode 173. As shown, semiconductor spacer 130 extends vertically (e.g., in z-dimension) from an interface of the lateral channel region and gate dielectric 172. In other words, semiconductor spacer 130 has a film thickness (as measured in a direction normal from an underlying interface) that is greater than the lateral channel region by a high-mobility semiconductor spacer thickness $V_s$. As such, the effective channel length $L_{eff,1}$ includes both the lateral distance (e.g., extending along x-axis) and the vertical distance, non-parallel (e.g., orthogonal) to the lateral distance (e.g., extending along the z-axis). As noted further below, the orthogonal channel region extends both vertically (e.g., in the z-dimension) and laterally (e.g., in the y-dimension) for a symmetric channel length extension in at least two dimensions.

In some embodiments further illustrated by FIG. 2A, semiconductor spacer 130 extends laterally (e.g., in x-dimension) beyond an outer edge of lateral spacer 171 by substantially (i.e. +/−10%) the same amount as semiconductor spacer 130 extends vertically beyond the outer edge of lateral spacer 171. In other words, semiconductor spacer 130 extends beyond lateral spacer 171 by $V_s$ in both the z-dimension and x-dimension. For such embodiments, the minimum effective channel length is at least equal to $L_{eff,1}$. For example, even an exclusively lateral carrier path represented by $L_{eff,2}$ is at least equal to $L_{eff,1}$. An exclusively lateral carrier path may be found at the longitudinal axis of fin 120, for example, while other paths will include an orthogonal component. Effective channel length is therefore substantially equal over the entire current carrying volume of fin 120 as a function of the semiconductor spacer 130 extending symmetrically in three dimensions (e.g., from a point on the edge of lateral spacer 171 intersecting fin 120).

In some embodiments, semiconductor spacer 130 is of the same material composition as the lateral channel region. Both lattice (sub-lattice) composition and impurity concentration are advantageously the same such that semiconductor spacer 130 is functionally a continuous, homogeneous portion of fin 120. In some embodiments, where the lateral channel region is intrinsic (i.e., no intentional doping), semiconductor spacer 130 is also intrinsic. For example, where the lateral channel region is intrinsic InGaAs, semiconductor spacer 130 may also be intrinsic InGaAs. In some alternate embodiments, semiconductor spacer 130 has the same majority lattice constituents as the lateral channel portion of fin 120, but a different impurity doping. For example, semiconductor spacer 130 may be lightly doped n-type to a higher impurity concentration than that of the lateral channel portion of fin 120. For example, where the lateral channel region is intrinsic InGaAs, semiconductor spacer 130 may be lightly n-type doped InGaAs. In some alternate embodiments, semiconductor spacer 130 has different majority lattice constituents than the lateral channel portion of fin 120, but a same impurity doping. For example, where the lateral channel region is intrinsic InGaAs with a first mole fraction of In between 0.2 and 0.8, semiconductor spacer 130 may be intrinsic InGaAs with a second (different) mole fraction of In between 0.2 and 0.8.

In some embodiments represented by FIG. 2A, semiconductor spacer 130 wraps around lateral spacer 171. Lateral spacer 171 may be any dielectric material, and may be in contact with a sidewall of gate electrode 173, or as shown, in contact with gate dielectric 172 that covers sidewalls of gate electrode 173. The lateral dimensions of lateral spacer 171 may vary anywhere from zero (where semiconductor spacer 130 is separated from gate electrode 173 only by gate dielectric 172) and 10 nm, for example. In some exemplary embodiments, lateral spacer 171 provides 3-5 nm of lateral spacing between gate electrode 173 and semiconductor spacer 130. Electrostatic coupling of a voltage-biased gate electrode to semiconductor spacer 130 can be significant, becoming more so as the dimensions of lateral spacers 171 are reduced toward zero. For such embodiments, $V_s$ may approach the z-height of gate electrode 173 to obtain a desired effective channel length.

As further illustrated by FIG. 2A, a regrown heteroepitaxial source/drain region 140 interfaces with the semiconductor spacer 130. In some embodiments, source/drain region 140 comprises a III-V compound semiconductor with lattice constituents distinct from those of fin 120 to provide an advantageously low band gap facilitating a low resistance with contact metallization 150. A second heterojunction 136 is therefore present between source/drain region 140 and semiconductor spacer 130. Heteroepitaxial source/drain region 140 may be of any material suitable for ohmic contact to fin 120, such as, but not limited to, InAs. In some embodiments, source/drain material 140 is single-crystalline. Source/drain region 140 is advantageously heavily doped (e.g., n-type in InAs embodiments). As shown in FIG. 2A, source/drain region 140 covers semiconductor spacer 130 such that metallization 150 interfaces with source/drain region 140 rather than semiconductor spacer 130 even if contact metallization is somewhat misaligned. Depending on the z-height of source/drain region 140, semiconductor spacer 130 may be covered by more or less source/drain material, which can be expected to convey considerable current being in close proximity to the gate stack.

In some embodiments represented by FIG. 2A, source/drain region 140 forms only one heterojunction 136. No second heterojunction is formed with sub-fin 110 because fin 120 extends over the entire length of sub-fin 110. As described further below, the region of fin 120 disposed between source/drain region 140 and sub-fin 110 is indicative of the technique employed to form semiconductor spacer 130. In some exemplary embodiments, the thickness of region of fin 120 disposed between source/drain region 140 and sub-fin 110 is substantially (i.e., +/−10%) equal to the high-mobility semiconductor spacer thickness $V_s$. This relationship to the semiconductor spacer thickness $V_s$ is indicative of a re-growth technique employed to form semiconductor spacer 130, as described further below. Beyond being indicative of the technique employed to form semiconductor spacer 130, the presence of fin 120 between source/drain region 140 and sub-fin 110 may provide advantageous band gap offsets reducing leakage between source/drain region 140 and sub-fin 110. The presence of fin 120 between source/drain region 140 and sub-fin 110 may also provide an advantageous setback between heavily doped source/drain region 140 and sub-fin 110, reducing diffusion of n-type dopants into sub-fin 110 which might otherwise increase leakage current between source/drain region 140 and sub-fin 110.

Figures 2B, 2C:
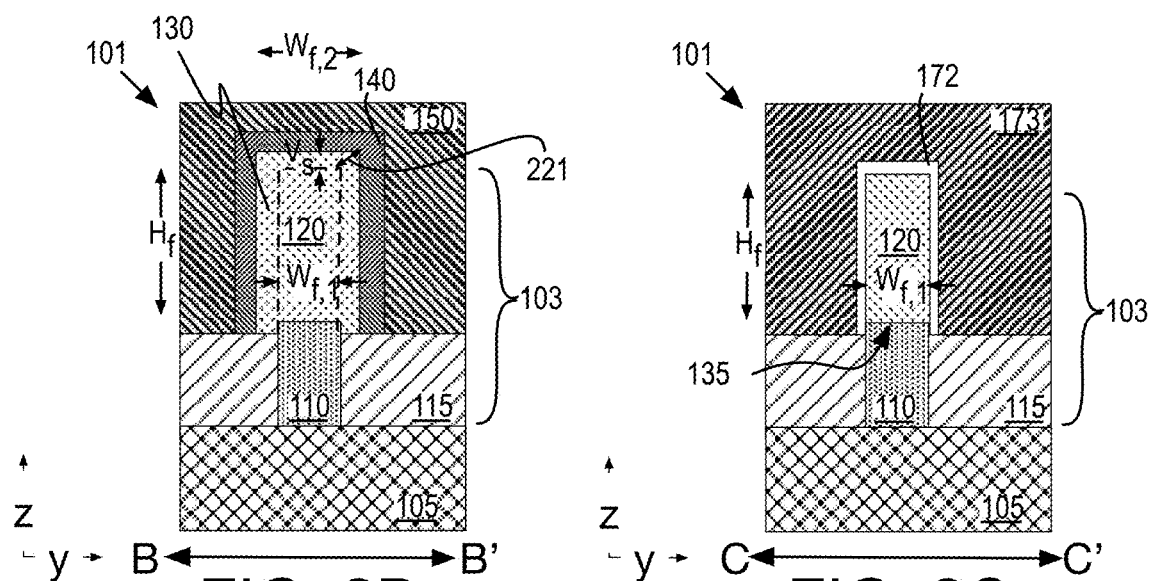
FIG. 2B illustrates a cross-sectional view through a fin width within a source/drain region of the high-mobility finFET depicted in FIG. 1, in accordance with some embodiments.
FIG. 2C illustrates a cross-sectional view through a fin width within a lateral channel region of the high-mobility finFET depicted in FIG. 1, in accordance with some embodiments.

FIG. 2B illustrates a cross-sectional view through a hetero-fin width along the B-B' plane denoted in FIG. 1, in accordance with some embodiments. The B-B' plane passes through source/drain region 140 of finFET 101 within high-mobility semiconductor spacer 130 near where the heterojunction 136 (FIG. 2A) forms an interface with fin 120 across the transverse fin width $W_{f,2}$. As further illustrated in FIG. 2B, semiconductor spacer thickness $V_s$ is visible as a dashed line denoting an extension of fin 120 along the entire fin z-height $H_f$. In contrast, semiconductor spacer thickness $V_s$ is substantially absent from the majority of sub-fin 110 embedded within sub-fin isolation 115. Sub-fin isolation 115 may be any amorphous material suitable for providing electrical isolation between adjacent sub-fins. In some exemplary embodiments, sub-fin isolation 115 is silicon dioxide. Other known dielectric materials may also be employed, including low-k materials. Although embodiments are not limited in this respect, other exemplary materials include carbon-doped oxides, siloxane derivatives, and the like.

As further noted in FIG. 2B, a corner portion of semiconductor spacer 130 has a corner thickness 221 greater than fin width $W_{f,1}$ that is at least equal to $V_s$. In exemplary embodiments, corner thickness 221 is significantly (e.g., at least 20%) larger than $V_s$. Notably, corner thickness 221 is indicative of the technique employed to form semiconductor spacer 130. As further described below, for exemplary embodiments where semiconductor spacer 130 is an overgrowth of fin 120 (i.e., an epitaxial growth on the surfaces of fin 120 defining fin width $W_{f,1}$), accelerated epitaxial corner growth will ensure effective channel length at the corners of fin 120 are not significantly shorter than anywhere else, and indeed will likely be longer (e.g., corner thickness 221>than $V_s$) reducing the current density at these locations that might otherwise experience a current crowding effect.

FIG. 2C illustrates a cross-sectional view through a fin width within a lateral channel region of the high-mobility finFET 101 along the C-C' plane depicted in FIG. 1, in accordance with some embodiments. As illustrated, a metal-insulator gate stack includes a gate dielectric material 172 and a gate electrode material 173. While any known gate stack materials may be utilized, in one exemplary embodiment a high-k material having a bulk relative dielectric constant of 9, or more is employed as the gate dielectric along with a gate metal that has a work function suitable for the composition of fin 120. In the exemplary embodiments illustrated by FIG. 2C, gate dielectric 172 is disposed directly on sidewalls of fin 120 that define the transverse fin width $W_{f,1}$. Just as noted above for FIG. 2B, "corners" of fin 120 within the lateral channel region illustrated by FIG. 2C are indicative of the technique employed to form semiconductor spacer 130 (FIG. 2B). For example, had a gate recess etch been performed to reduce a fin of width $W_{f,2}$ down to $W_{f,1}$ within the lateral channel region, the profile of fin 120 illustrated in FIG. 2 would display much more corner erosion than is represented in the profile of FIG. 2B. Just as epitaxial growth is accelerated at corners, the larger solid angle at outside corners of a feature also accelerates recess etch mechanisms.

Figure 3A:
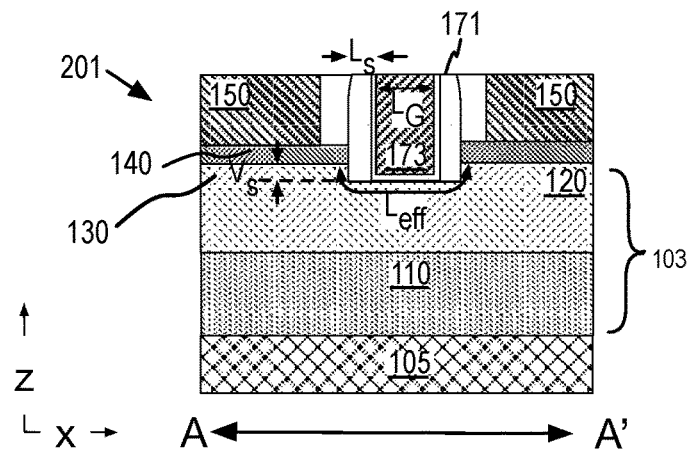
FIG. 3A illustrates a cross-sectional view through a length of channel region and source/drain of the high-mobility finFET depicted in FIG. 1, in accordance with some alternate embodiments.
Figure 3B:
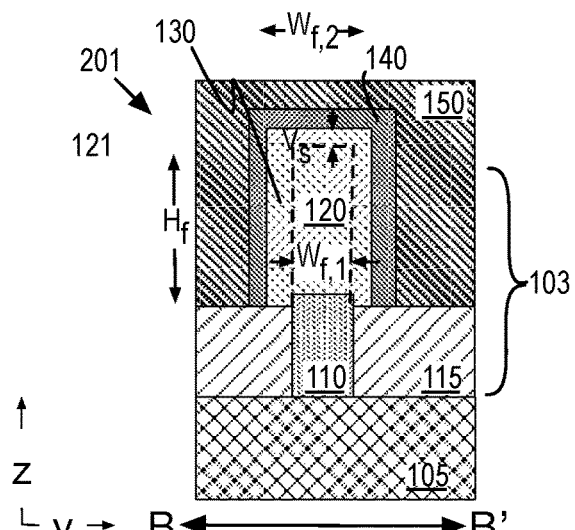
FIG. 3B illustrates a cross-sectional view through a fin width within a source/drain region of the high-mobility finFET depicted in FIG. 1, in accordance with some alternate embodiments.
Figure 3C:
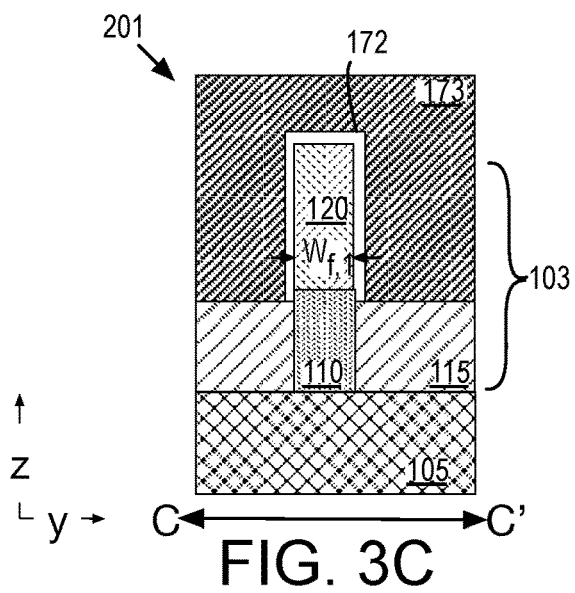
FIG. 3C illustrates a cross-sectional view through a fin width within a lateral channel region of the high-mobility finFET depicted in FIG. 1, in accordance with some alternate embodiments.
Figure 4A:
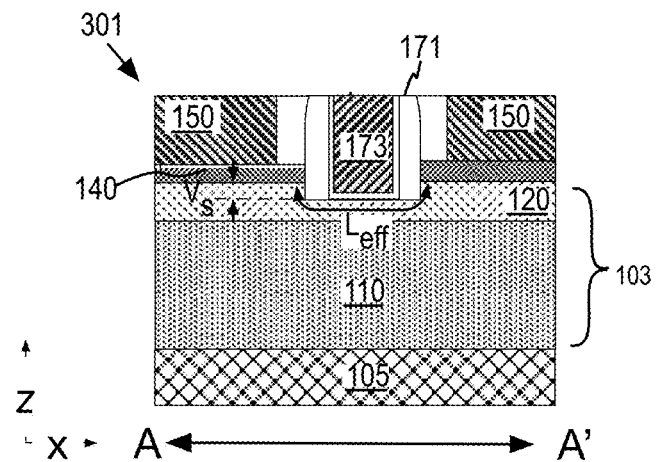
FIG. 4A illustrates a cross-sectional view through a length of channel region and source/drain of the high-mobility finFET depicted in FIG. 1, in accordance with some alternate embodiments.
Figure 4B:
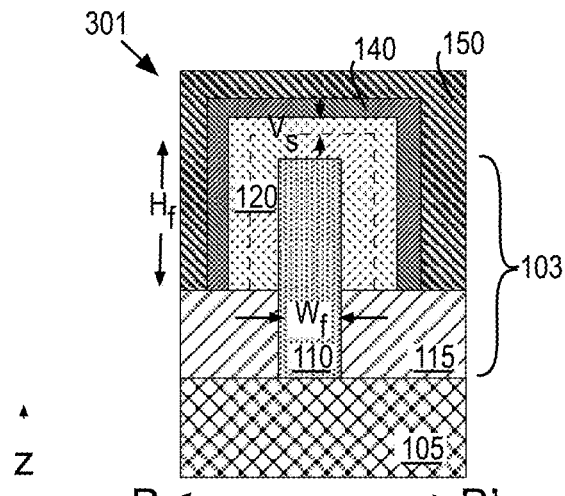
FIG. 4B illustrates a cross-sectional view through a fin width within a source/drain region of the high-mobility finFET depicted in FIG. 1, in accordance with some alternate embodiments.
Figure 4C:
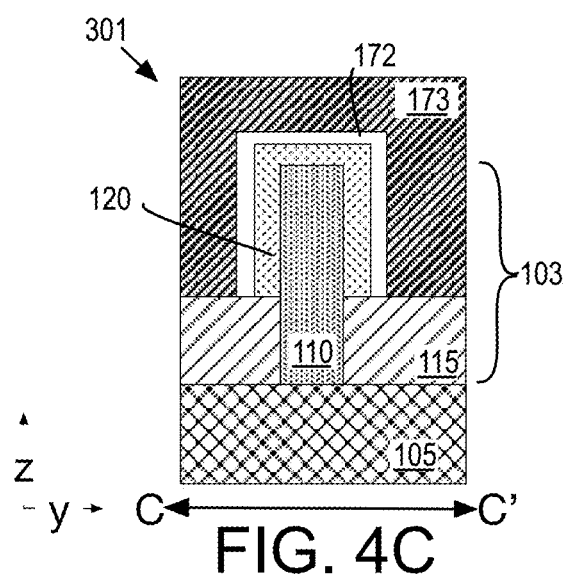
FIG. 4C illustrates a cross-sectional view through a fin width within a lateral channel region of the high-mobility finFET depicted in FIG. 1, in accordance with some alternate embodiments.
Figure 5:
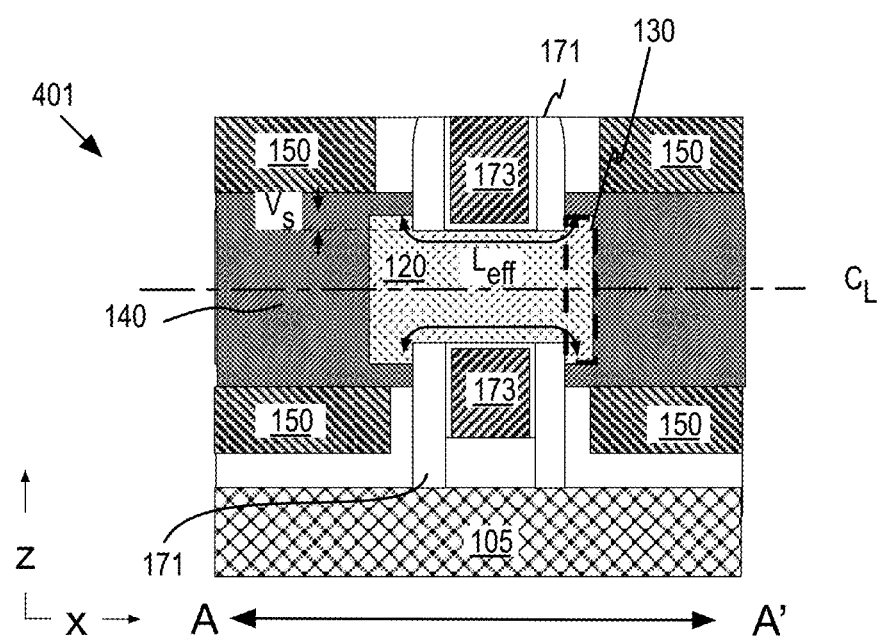
FIG. 5 illustrates a cross-sectional view through a length of channel region and source/drain of the high-mobility finFET depicted in FIG. 1, in accordance with some alternate embodiments.

Notably, the architectural elements described above in the context of finFET 101 may be applied to a wide array of other finFET architectures. FIG. 3A-3C, for example, depict a finFET 201 in accordance with some alternate embodiments. FinFET 201 has substantially the same layout as illustrated in FIG. 1 for finFET 101. However, finFET 201 employs a raised source/drain region 140 disposed over a full-height fin 120. As a further example, FIG. 4A-4C depict a finFET 301 having substantially the same layout as illustrated in FIG. 1 for finFET 101. FinFET 301 however has a high-mobility channel that wraps around sidewalls of a sub-fin. As still another example, FIG. 5 depicts a nanowire FET 401 having substantially the same layout as illustrated in FIG. 1 for finFET 101. Nanowire FET 401 however has a gate stack and source/drain region that wraps completely around a high-mobility channel material.

FIG. 3A illustrates a cross-sectional view of finFET 201 through the A-A' plane depicted in FIG. 1, in accordance with some alternate embodiments. FIG. 3B illustrates a cross-sectional view of finFET 201 through the B-B' plane depicted in FIG. 1, in accordance with some alternate embodiments. Likewise, FIG. 3C illustrates a cross-sectional view of finFET 201 through the C-C plane depicted in FIG. 1, in accordance with some alternate embodiments. Referring first to FIG. 3A, sub-fin 110 and fin 120 may have any of the properties discussed above in the context of finFET 101. The material thickness $V_s$ associated with the semiconductor spacer 130 (FIG. 3B) stands-off raised source/drain region 140. Source/drain region 140 may again have any of the properties described above in the context of finFET 101 (e.g., heteroepitaxial highly-doped narrow bandgap material). Source/drain region 140 forms a shell around end portions of fin 120, as further illustrated by FIG. 3B. The profile illustrated in FIG. 3B is applicable over the entire source/drain contact length because the z-height of fin 120 beyond lateral spacer 171 is constant (i.e., source/drain region 140 does not replace any portion of fin 120). The minimum effective gate length $L_{eff}$ is therefore increased by (twice) $V_s$. For embodiments where most source/drain current is carried within an outer skin of the lateral channel portion illustrated in FIG. 3C, the minimum effective gate length $L_{eff}$ would be dominant with carrier paths nearer the longitudinal axis of fin 120 having a longer effective channel length.

FIG. 4A illustrates a cross-sectional view of finFET 301 through the A-A' plane depicted in FIG. 1, in accordance with some alternate embodiments. FIG. 4B illustrates a cross-sectional view of finFET 301 through the B-B' plane depicted in FIG. 1, in accordance with some alternate embodiments. Likewise, FIG. 4C illustrates a cross-sectional view of finFET 301 through the C-C plane depicted in FIG. 1, in accordance with some alternate embodiments. Referring first to FIG. 4A, sub-fin 110 and fin 120 may have any of the properties discussed above in the context of finFET 101. The film thickness $V_s$ (FIG. 4B) associated with semiconductor spacer 130 again stands-off raised source/drain region 140. Source/drain region 140 may have any of the properties described above in the context of finFET 101 (e.g., heteroepitaxial highly-doped narrow bandgap material). In finFET 301, fin 120 clads, or forms a shell around, sub-fin 110, which extends nearly the full fin height $H_f$. In this architecture, the hetero-fin 103 comprises a semi-radial stacking of the two materials 110, 120. Depending on dimensions, finFET 101 may operate as a single-gated surface channel device or as a double-gated channel device. As shown in FIGS. 4B and 4C, the difference between source/drain ends and lateral channel portion of the hetero-fin 103 arises from variation in the cladding thickness (e.g., cladding thickness increases by $V_s$ at source/drain ends).

FIG. 5 illustrates a cross-sectional view of nanowire FET 401 through the A-A' plane depicted in FIG. 1, in accordance with some embodiments. As shown, semiconductor spacer 130 is substantially symmetrical about a longitudinal axis $C_L$ of fin 120. In this illustrative embodiment, the sub-fin is absent having been completely replaced with gate stack materials, source/drain 140, and contact metallization 150. With semiconductor spacer 130 having a greater radial dimension than that of the lateral channel region, the channel of nanowire FET 401 is effectively necked along the lateral gate length $L_g$, causing source/drain current to flow radially through fin 120 as well as longitudinally.

Figure 6:
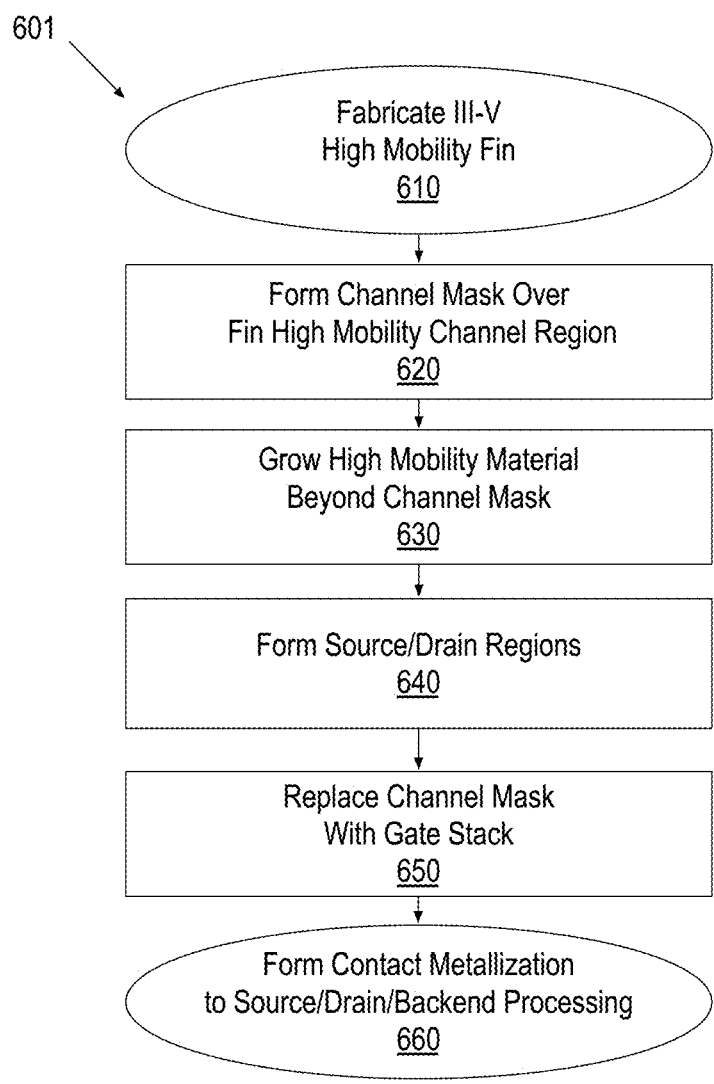
FIG. 6 is a flow diagram illustrating a method of fabricating a high-mobility finFET with a high-mobility semiconductor source/drain spacer, in accordance with some embodiments.

High-mobility finFETs in accordance with the architectures above may be fabricated by a variety of methods applying a variety of techniques and processing chamber configurations. FIG. 6 is a flow diagram illustrating an exemplary method 601 for fabricating a high-mobility finFET with a high-mobility semiconductor spacer, in accordance with some embodiments. FIGS. 7A, 7B, 7C, 7D, 7E, and 7F illustrate cross-sectional views along the A-A' plane of finFET 101 evolving as the method 601 is performed, in accordance with some embodiments. FIGS. 8A, 8B, 8C, 8D, 8E, and 8F illustrate cross-sectional views along the B-B' plane of finFET 101 evolving as the method illustrated in FIG. 6 is performed, in accordance with some embodiments.

Referring first to FIG. 6, method 601 begins at operation 610 where a fin of high-mobility material is formed. In some embodiments, III-V hetero-junction fins are fabricated, for example by epitaxially growing numerous islands of III-V material over a silicon substrate having a plurality of seeding surface regions. In some such embodiments, seeding surface regions are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of thermal mismatch across various heterojunctions. In alternative embodiments, a conventional subtractive technique may be employed in which a blanket III-V film stack is grown over, or transferred to, an entire working surface of the substrate, or transferred to the substrate. That blanket film stack is then etched into fin structures similarly amenable to subsequent operations of method 601.

Figure 7A:
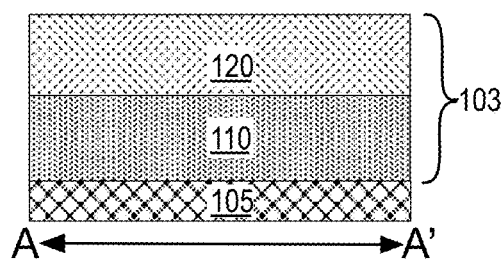
FIGS. 7A, 7B, 7C, 7D, 7E, and 7F illustrate cross-sectional views through a length of the channel region and source/drain regions of a high-mobility finFET evolving as the method illustrated in FIG. 6 is performed, in accordance with some embodiments.
Figure 8A:
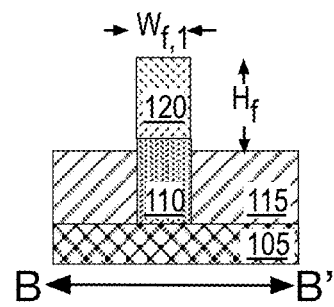
FIGS. 8A, 8B, 8C, 8D, 8E, and 8F illustrate cross-sectional views through a width of a fin structure within a region of a high-mobility finFET evolving as the method illustrated in FIG. 4 is performed, in accordance with some embodiments.

In the exemplary embodiments illustrated by FIGS. 7A and 8A, upon completion of operation 610, hetero-fin 103 is disposed on substrate 105 with at least a portion of fin 120 extending beyond surrounding sub-fin isolation 115 by a z-height $H_f$. In some embodiments, z-height $H_f$ is defined by recess etching a predetermined amount of sub-fin isolation material 115 from around hetero-fin 103. Z-height $H_f$ may vary with the extent of recess etch, potentially exposing sidewalls of sub-fin 110. In alternate embodiments, a stop layer may be utilized to ensure a top surface of sub-fin isolation 115 is flush with the heterojunction between sub-fin 110 and fin 120. At this point, transverse fin width $W_{f,1}$ is substantially constant along the entire longitudinal length of fin 120.

Returning to FIG. 6, method 601 continues at operation 620 where a channel mask is patterned to protect a portion of the high-mobility fin that is to become the FET channel region. While any known masking technique and material(s) may be employed at operation 620, in some embodiments, the channel mask is a gate mandrel retained through a number of processes until being replaced in a "gate-last" finFET fabrication flow. Such embodiments may be advantageously compatible with silicon-channeled finFET fabrication, for example enabling PMOS transistors to be concurrently fabricated in other regions of the substrate (not depicted).

Figure 7B:
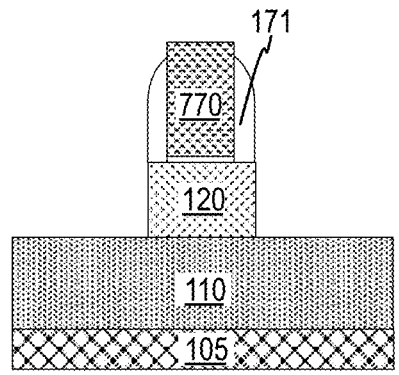
Figure 8B:
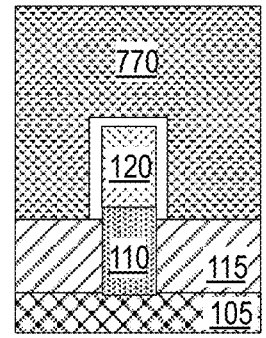

In the exemplary embodiment illustrated in FIGS. 7B and 8B, a sacrificial gate 770 is formed over a portion of the hetero-fin 103. Any known sacrificial gate structure and fabrication techniques may be employed at operation 620 to form sacrificial gate 770 on at least two opposing sidewalls of fin 120. Sacrificial gate 770 is patterned into a stripe of sacrificial material extending over the channel region of fin 120 and landing on sub-fin isolation 115. Other portions of hetero-fin 103 are exposed. In further embodiments represented by FIG. 7B, the channel mask further includes a dielectric lateral sidewall spacer 171 adjacent to sacrificial gate 770. Any conventional self-aligned lateral spacer process may be employed at operation 620 to laterally stand-off subsequent processing from sacrificial gate 770. For example, a dielectric (e.g., silicon dioxide and/or silicon nitride) may be conformally deposited over the hetero-fin and over the channel mask. An anisotropic etch is then employed to clear the dielectric except along edged of topography.

Returning to FIG. 6, method 601 continues at operation 630 where high-mobility material is epitaxially grown on surfaces of the fin not protected by the channel mask or sub-fin isolation. This high-mobility material may be of the same or different composition as the fin. As such, both the features of the exposed fin portions and characteristics of the overgrowth process may be utilized to properly stand-off subsequently formed source/drain regions with high-mobility semiconductor material. In some embodiments, the high-mobility spacer material is grown substantially as an overgrowth of source/drain regions with the exception that the material epitaxially grown for the spacer is substantially is grown with much lower in-situ doping. In some embodiments, the material overgown has the same composition as that of the crystalline seeding surfaces of the fin, including the same (low) impurity dopant concentration, or having perhaps a slightly higher impurity concentration than the seeding fin material.

Depending on the architecture of the device channel (e.g., bulk fin, cladding, etc.) and the source/drain (e.g., replaced, raised, etc.), portions of the fin not protected by the channel mask or sub-fin isolation may be recess etched prior to epitaxially overgrowth of the high-mobility spacer. In the example illustrated by FIG. 7B, portions fin 120 not protected by the channel mask or sub-fin isolation 115 are recessed etched. This recess etch may undercut lateral spacer 171 by some predetermined amount, or not. A crystallographic wet etchant may be employed or a low damage, chemical dry etchant, for example. In some embodiments, fin 120 is recessed etched selectively to sub-fin 110. Once surfaces of fin 120 and/or sub-fin 110 have been prepared for seeding an epitaxial growth, the high-mobility material of fin 120 is regrown.

Figure 7C:
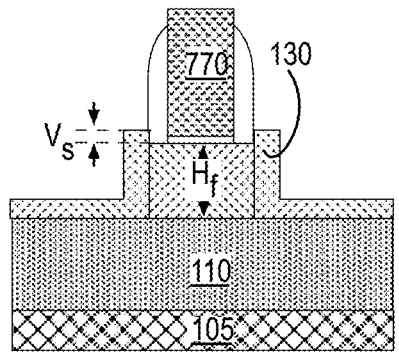
Figure 8C:
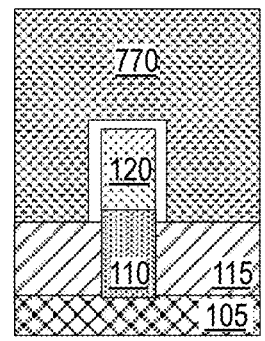
Figure 7D:
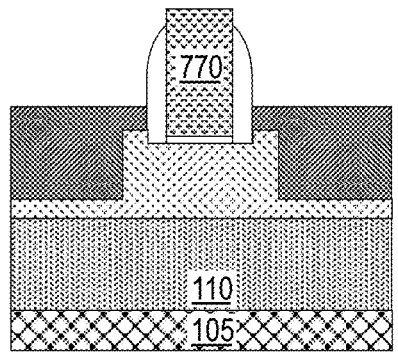
Figure 8D:
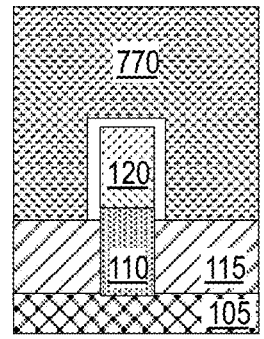
Figure 7E:
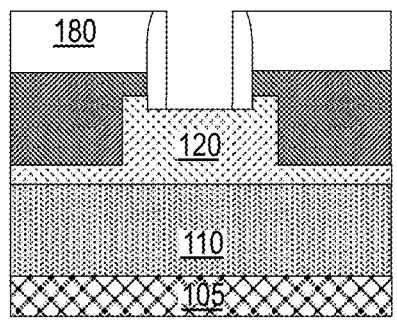
Figure 8E:
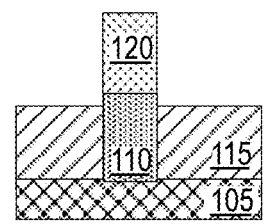

As further illustrated in FIG. 7C, high-mobility semiconductor spacer 130 is grown, for example by any of metal-organic chemical vapor deposition (MOCVD), molecular beam epitaxy (MBE), hydride vapor phase epitaxy (HVPE), or the like. The epitaxial material (e.g., InGaAs or other III-V material) may be intrinsic (i.e., not intentional in-situ doped). As illustrated in FIG. 7C, the overgrowth wraps around lateral spacer 171 increasing the effective fin height $H_f$ by the amount $V_s$, and increasing the fin width $W_{f,1}$ to $W_{f,2}$.

In alternate embodiments, no recess etching of fin 120 is performed at operation 630, and instead high-mobility semiconductor spacer 130 is overgrown only on sidewalls of fin 120 to increase the effective fin height $H_f$ by the thickness $V_s$, and increase the fin width $W_{f,1}$ to $W_{f,2}$.

Upon completing overgrowth of the high-mobility material, method 601 proceeds to operation 640 where source/drain regions are formed. In some embodiments of operation 640, the epitaxially re-growth and/or overgrowth of fin 120 initiated at operation 630 is continued. Instead of being substantially undoped however, a heavily-doped semiconductor is grown. In further embodiments, heavily-doped III-V semiconductor of a different composition than that of fin 120 is heteroepitaxially grown from seeding surfaces of semiconductor spacer 130. Any known epitaxial source/drain regrowth technique may be employed. In exemplary embodiments further illustrated in FIGS. 7D and 8D, a single crystalline heteroepitaxial source/drain region 140 is then grown by any known technique. This material (e.g., InAs or other III-V material) may be heavily in-situ doped (e.g., n-type).

Returning to FIG. 6, method 601 continues at operation 650 where the channel mask is replaced with a permanent gate stack. Method 601 is then substantially completed with any suitable contact metallization and backend processing performed at operation 660. For the exemplary embodiment further illustrated in FIGS. 7E and 7E, finFET isolation 180 is deposited and planarized to expose a top of sacrificial gate 770. Sacrificial gate 770 is removed selectively relative to isolation 180, thereby exposing the lateral channel region of fin 120. At this point, an optional a gate channel recess etch may be performed to further increase the orthogonal channel component. For such a gate recess, at least two sidewalls of fin 120 are etched back (e.g., 1-3 nm). Notably, such a recess etch may not be as controllable as the epitaxial regrowth operation 630, and so may be avoided if the regrown operation achieves the desired source/drain spacer distance (i.e., $V_s$).

Figure 7F:
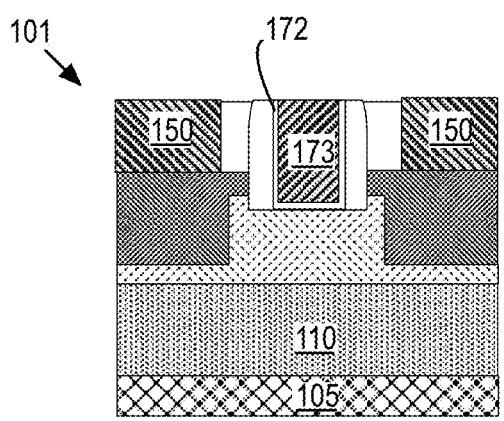
Figure 8F:
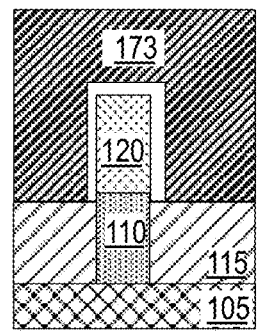

Following the optional channel (gate) recess etch, a permanent gate stack including a gate dielectric 172 and gate electrode 173 is formed over at least two sidewalls of the fin structures, as depicted in FIGS. 7F and 8F. While any known gate stack materials may be utilized, in one exemplary embodiment a high-k dielectric material is deposited along with a metal gate electrode having a work function suitable for the III-V composition of fin 120. As further illustrated in FIGS. 7F and 8F, source/drain contact metallization 150 is formed by any known technique. FinFET 101 is then substantially as introduced in FIGS. 1 and 2A-2C.

Figure 9:
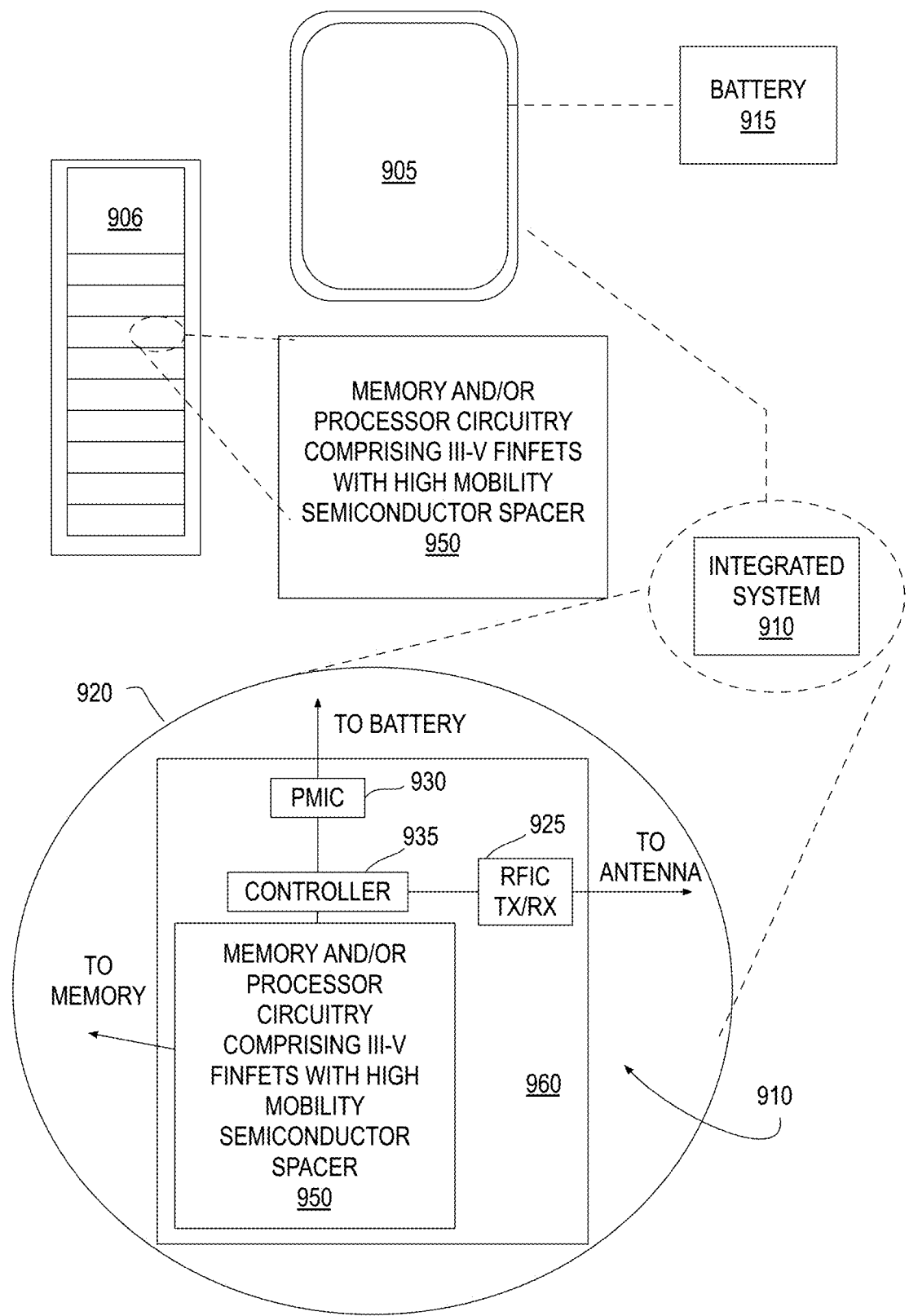
FIG. 9 illustrates a mobile computing platform and a data server machine employing an SoC including a plurality of high-mobility finFETs including a high-mobility semiconductor source/drain spacer, in accordance with embodiments of the present invention.

FIG. 9 illustrates a mobile computing platform and a data server machine employing an SoC including III-V finFETs with a high-mobility semiconductor spacer, for example as describe elsewhere herein. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, packaged monolithic SoC 950 includes a memory block (e.g., RAM), a processor block (e.g., a microprocessor, a multi-core microprocessor, graphics processor, or the like) including at least one heteroepitaxial III-V n-type transistor with a high-mobility semiconductor spacer, for example as describe elsewhere herein. The monolithic SoC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 950.

Figure 10:
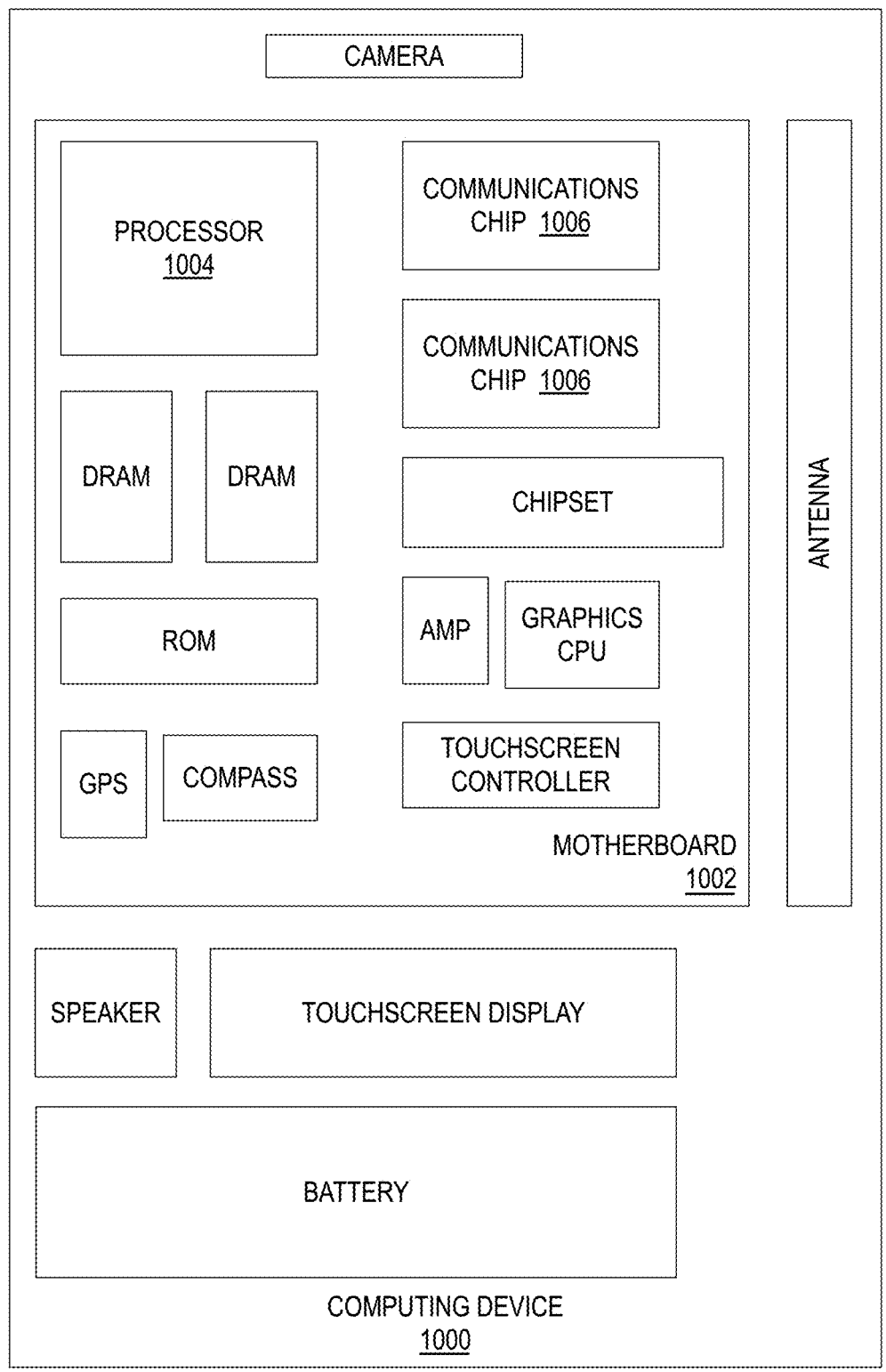
FIG. 10 is a functional block diagram of an electronic computing device, in accordance with an embodiment of the present invention.

FIG. 10 is a functional block diagram of an electronic computing device, in accordance with an embodiment of the present invention. Computing device 1000 may be found inside platform 905 or server machine 906, for example. Device 1000 further includes a motherboard 1002 hosting a number of components, such as, but not limited to, a processor 1004 (e.g., an applications processor), which may further incorporate at least one III-V finFET with a high-mobility semiconductor spacer, for example as describe elsewhere herein. Processor 1004 may be physically and/or electrically coupled to motherboard 1002. In some examples, processor 804 includes an integrated circuit die packaged within the processor 10904. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a monolithic transistor comprises a fin of a first semiconductor material disposed over a substrate. A gate stack is disposed over a lateral channel region of the fin. A pair of semiconductor source/drain regions are laterally spaced apart from the gate stack by a gate sidewall spacer, and vertically spaced apart from the lateral channel region by a thickness of semiconductor material having a lower impurity concentration than the source/drain regions.

In at least one of the first embodiments, the source/drain regions are vertically spaced apart from the lateral channel region by a thickness of the first semiconductor material, and the first semiconductor has a carrier mobility greater than that of silicon.

In the embodiment immediately above, a first height of the fin from the substrate beyond the gate sidewall spacer is greater than a second height of the fin within the lateral channel region, and a first width of the fin beyond the gate sidewall spacer is greater than a second width of the fin within the lateral channel region.

In the embodiment immediately above, the first width of the fin is greater than the second width of the fin by twice the difference between the first and second heights.

In at least one of the first embodiments, the first semiconductor material comprises a fin of a first III-V compound semiconductor material disposed on a sub-fin of a second III-V compound semiconductor. The pair of source/drain regions further comprise a third III-V compound semiconductor material in contact with the first III-V compound semiconductor material. The third III-V compound semiconductor is separated from the second III-V compound semiconductor material by the first III-V compound semiconductor material.

In at least one of the first embodiments, the substrate is silicon, and the first semiconductor material is selected from the group consisting of: InGaAs, InAs, InP, and InSb.

In at least one of the embodiments immediately above, the first semiconductor material comprises a fin of a first III-V compound semiconductor material disposed on a sub-fin of a second III-V compound semiconductor selected from the group consisting of: AlSb, GaSb, GaAlSb, GaAsSb, InAlAs, GaAs, and AlGaAs.

In at least one of the first embodiments, the thickness of the semiconductor material vertically spacing the source/drain regions apart from the lateral channel region has the same impurity dopant concentration as the lateral channel region. The gate sidewall spacer comprises a gate insulator of the gate stack, and the gate sidewall spacer separates a sidewall of a metal gate electrode of the gate stack from a top surface of the semiconductor material vertically spacing the source/drain regions apart from the lateral channel region.

In one or more second embodiments, a CMOS integrated circuit (IC), comprises a silicon substrate, an n-type III-V-channeled fin field effect transistor (FET) disposed over a first region of the substrate, and a p-type silicon-channeled finFET disposed over a second region of the substrate. The III-V finFET further includes a fin of a first III-V compound semiconductor material, a metal-insulator gate stack and a gate stack sidewall spacer disposed over a lateral channel region of the first III-V compound semiconductor material, and a pair of semiconductor source/drain regions laterally spaced apart from the gate stack by a gate sidewall spacer, and vertically spaced apart from the lateral channel region by a thickness of semiconductor material having a lower impurity concentration than the source/drain regions.

In at least one of the second embodiments, the source/drain regions are vertically spaced apart from the lateral channel region by a thickness of the first semiconductor material. The first semiconductor has a carrier mobility greater than that of silicon. A first height of the fin beyond the gate sidewall spacer is greater than a second height of the fin within the lateral channel region, a first width of the fin beyond the gate sidewall spacer is greater than a second width of the fin within the lateral channel region, and the p-type finFET comprises a fin of a width equal to the second width.

In at least one of the second embodiments, a gate length associated with the n-type finFET is less than a corresponding gate length associated with the p-type finFET. A difference between the effective channel length and the gate length of the n-type finFET is greater than that of an effective channel length of the p-type finFET.

In at least one of the second embodiments, a substrate area occupied by the n-type finFET is smaller than that occupied by the p-type finFET.

In at least one of the second embodiments, the first semiconductor material is selected from the group consisting of: InGaAs, InAs, InP, and InSb. The fin is disposed on a sub-fin of a second III-V compound semiconductor material selected from the group consisting of: AlSb, GaSb, GaAlSb, GaAsSb, InAlAs, GaAs, and AlGaAs.

In one or more third embodiments, a method of fabricating a high carrier mobility fin field effect transistor (FET), the method comprises forming a fin disposed on a substrate, the fin comprising a monocrystalline semiconductor material having a high carrier mobility. The method further comprises masking a lateral channel region of the fin. The method further comprises epitaxially growing a spacer of a semiconductor material having high carrier mobility at ends of the fin beyond the mask. The method further comprises forming source and drain regions at the ends of the fin, the source and drain regions doped to a higher impurity concentration than the spacer.

In at least one of the third embodiments, the method further comprises forming a gate stack over the lateral channel region. The method further comprises forming contact metallization to the source and drain regions.

In at least one of the third embodiments, epitaxially growing the spacer further comprises growing an additional thickness of the semiconductor material employed in the lateral channel region.

In at least one of the third embodiments, epitaxially growing the spacer further comprises recess etching the high-mobility semiconductor material not covered by the mask, and epitaxially growing a monocrystalline layer of the high-mobility semiconductor material along monocrystalline seeding edges of the recess.

In at least one of the third embodiments immediately above, epitaxially growing the high-mobility semiconductor material further comprises growing a III-V compound semiconductor material having the same composition as the high-mobility semiconductor material recess etched.

In at least one of the third embodiments, recess etching the high-mobility semiconductor material exposes a surface of a sub-fin disposed below the fin, the sub-fin further comprises a second semiconductor material, and epitaxially growing the layer of the high-mobility semiconductor material further comprises growing the high-mobility semiconductor material on the exposed surface of the second semiconductor material and on a sidewall surface of the lateral channel region.

In at least one of the third embodiments, forming the mask over the lather channel region further comprises depositing a sacrificial gate stack, patterning the sacrificial gate stack into a stripe extending over the lateral channel region, and forming a dielectric lateral spacer adjacent to sidewalls of the stripe.

In at least one of the third embodiments, forming the gate stack over the lateral channel region further comprises recess etching the channel region of the fin after removing the mask, depositing a high-k gate dielectric material over recessed lateral channel region surfaces, and depositing a gate metal over the high-k gate dielectric.

In at least one of the third embodiments, forming the fin further comprises forming a fin of a III-V compound semiconductor material selected from the group consisting of: InGaAs, InAs, InP, and InSb.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A CMOS integrated circuit (IC) structure, comprising:
   a substrate comprising silicon;
   an n-type III-V field effect transistor (FET) over a first region of the substrate, the n-type III-V FET further including:
      a channel region comprising a first III-V material;
      a gate stack over the channel region;
      a gate sidewall spacer adjacent to the gate stack; and
      a source and drain comprising a second semiconductor material, the source and drain each laterally spaced apart from the gate stack by at least a first portion of the gate sidewall spacer, the source and drain vertically spaced apart from the first III-V material by at least a thickness of an intervening III-V semiconductor material that is adjacent to a second portion of the sidewall spacer; and
   a p-type silicon FET over a second region of the substrate, wherein a difference between an effective channel length and a gate length of the n-type FET is greater than a corresponding difference between an effective channel length and a gate length of the p-type FET by an amount at least equal to the thickness of the intervening III-V semiconductor material.

2. The CMOS IC structure of claim 1, wherein:
   a gate length associated with the n-type FET is less than a corresponding gate length associated with the p-type FET.

3. The CMOS IC structure of claim 2, wherein a substrate area occupied by the n-type FET is smaller than that occupied by the p-type FET.

4. A CMOS integrated circuit (IC) structure, comprising:
   a substrate comprising silicon;
   a p-type field effect transistor (FET) over a first region of the substrate, the p-type FET further including:
      a channel region comprising a first semiconductor material comprising Ge;
      a gate stack over the channel region;
      a gate sidewall spacer adjacent to the gate stack; and
      a source and drain comprising a second semiconductor material, the source and drain each laterally spaced apart from the gate stack by at least a first portion of the gate sidewall spacer, the source and drain vertically spaced apart from the first semiconductor material by at least a thickness of an intervening high-mobility semiconductor material that is adjacent to a second portion of the sidewall spacer; and
   an n-type FET over a second region of the substrate, wherein a difference between an effective channel length and a gate length of the p-type FET is greater than a corresponding difference between an effective channel length and a gate length of the n-type FET by an amount at least equal to the thickness of the intervening semiconductor material.

5. The CMOS IC structure of claim 4, wherein:
a gate length associated with the p-type FET is less than a corresponding gate length associated with the n-type FET.

6. The CMOS IC structure of claim 5, wherein a substrate area occupied by the p-type FET is smaller than that occupied by the n-type FET.

* * * * *